United States Patent [19]

Kantorowicz

[11] 4,380,744

[45] Apr. 19, 1983

[54] STABILIZED OSCILLATOR FOR MICROWAVES WITH FREQUENCY CONVERSION AND ITS SOLID STATE CONSTRUCTION

[75] Inventor: Gérard Kantorowicz, Paris, France

[73] Assignee: Thomson - CSF, Paris, France

[21] Appl. No.: 158,864

[22] Filed: Jun. 12, 1980

[30] Foreign Application Priority Data

Jun. 15, 1979 [FR] France .................. 79 15452

[51] Int. Cl.³ ........................... H03B 9/14
[52] U.S. Cl. ...................... 331/107 R; 331/96; 331/175
[58] Field of Search ............ 331/96, 107 R, 107 G, 331/177 V, 175

[56] References Cited

U.S. PATENT DOCUMENTS

| | | | |
|---|---|---|---|
| 3,510,800 | 5/1970 | Kaneko et al. | 331/175 |
| 3,735,286 | 5/1973 | Vane | 331/107 G X |
| 3,843,937 | 10/1974 | Hayashi et al. | 331/96 X |
| 4,270,099 | 5/1981 | Gill et al. | 331/96 |

OTHER PUBLICATIONS

Kostyler et al., "Tuning of Gunn Oscillators by an Electrically Controlled Capacitance", Telecommunications and Radio Engr. vol. 28, No. 3, Mar. 1973, pp. 133-134.

Hirai et al., "New Types of Frequency-Stabilized Oscillator", Toshiba Review, No. 115, May–Jun. 1978, pp. 37-41.

Hirachi et al., "High-power 50-GHz double-drift region with improved bias circuits for eliminating low--freq. instabilities", IEEE Trans. on Microwave Theory & Techniques, vol. MTT-24, No. 11, pp. 731-737, Nov. 1976.

Primary Examiner—Siegfried H. Grimm
Assistant Examiner—Edward P. Westin
Attorney, Agent, or Firm—Roland Plottel

[57] ABSTRACT

An oscillator including, a parametric amplifier which has three branches at the terminals of a non-linear capacitor C(V). In the pump branch there is a negative resistance dipole (D) which is able to oscillate at frequency $f_p$. One of the two other branches is matched to a resonant circuit ($C_s$) exhibiting a high Q factor at frequency $f_s$, and the other branch is matched to a load impedance, namely that of resonant circuit ($C_o$) at frequency $f_o \cdot (f_o = f_p - f_s)$. A high level output signal $f_o$ is thus provided.

7 Claims, 5 Drawing Figures

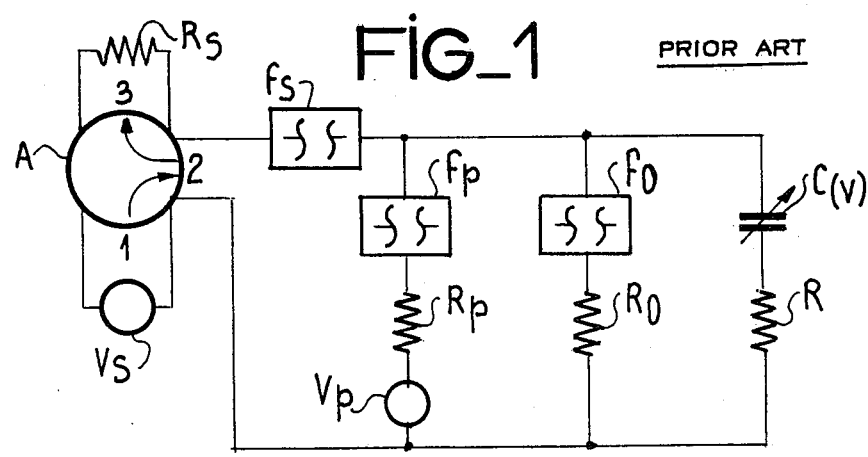
FIG_1 PRIOR ART
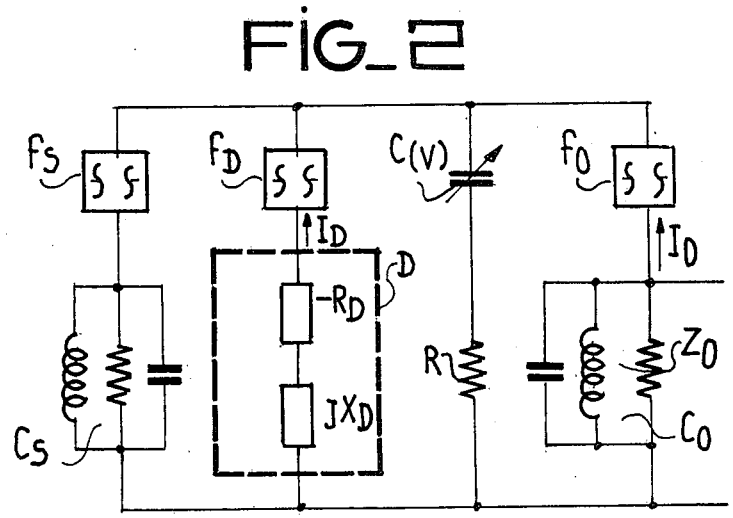
FIG_2
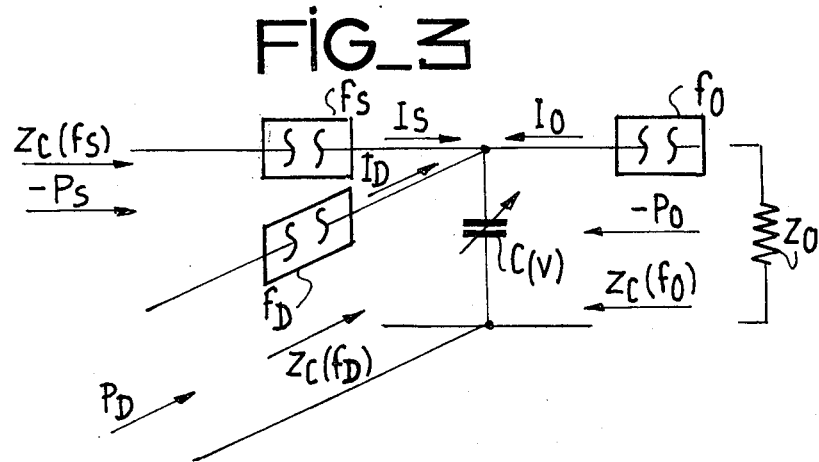
FIG_3

FIG_4
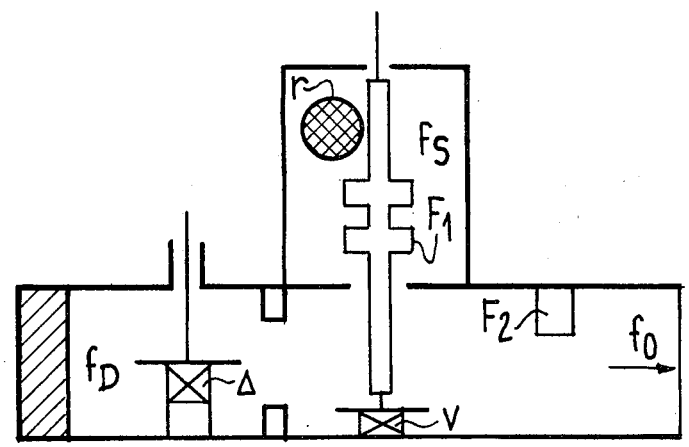
FIG_5
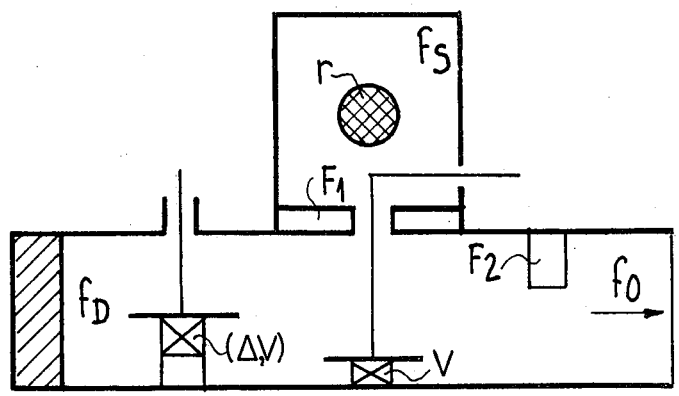

STABILIZED OSCILLATOR FOR MICROWAVES WITH FREQUENCY CONVERSION AND ITS SOLID STATE CONSTRUCTION

BACKGROUND OF THE INVENTION

The invention relates to a stabilized microwave oscillator.

The oscillators according to the invention have a structure similar to parametric amplifiers. It provides a microwave stabilized on a frequency $f_o$.

Parametric amplifiers have three essential parts corresponding to three frequencies: signal frequency $f_s$, pump frequency $f_p$ and image or idler frequency $f_o$. They cooperate with one another in the manner described below.

A first source of signal frequency $f_s$ and a second source at the pump frequency $f_p$ are arranged in parallel at the terminals of a nonlinear or parametric capacitor, whose value $C(V)$ varies with the voltage applied to its terminals. Capacitor $C(V)$ behaves like a negative resistance for the frequency signal $f_s$ which is amplified. At the same time a signal at frequency $f_o$, equal to the difference between the two frequencies $f_p$ and $f_s$, ($f_o = f_p - f_s$) appears in a third branch also connected in parallel at the terminals of the capacitor.

The frequency $f_p$ or pump frequency is generally much higher than the signal frequency $f_s$, and the power level at the frequency $f_p$ is much higher than that of the signal at the frequency $f_s$. The source at the pump frequency $f_p$ modifies the impedance at frequency $f_s$ and causes amplification on said frequency $f_s$. Frequency $f_o$ is itself much higher than frequency $f_s$.

The same arrangement is used in the invention for another purpose, namely that of stabilizing an oscillation frequency. The frequency stabilized in the device according to the invention is frequency $f_o$. No further description will be given here of the theory of parametric amplifiers and in this connection reference can be made to the work by W. H. Louisell "Coupled Mode and Parametric Electronics", Wiley and Sons, New York 1960.

It is merely pointed out that in the case of the invention, this arrangement makes it possible to use for the stabilization of frequency $f_o$, those elements resonating at a much lower frequency $f_s$, and which are therefore able to give a higher quality factor. The signal at frequency $f_o$ is obtained by frequency transposition or conversion with a signal-to-noise ratio very close to that which would be obtained with a frequency directly stabilized by the circuit having a high quality factor.

BRIEF DESCRIPTION OF THE DRAWINGS

The invention is described in greater detail hereinafter with reference to non-limitative embodiments and the attached drawings, which show:

FIG. 1 the diagram of a prior art parametric amplifier.

FIG. 2 the diagram of a stabilized oscillator according to the invention.

FIG. 3 another diagram relating to the same oscillator.

FIGS. 4 and 5 two embodiments of the construction in solid state form of the oscillator of FIG. 3.

DETAILED DESCRIPTION

FIG. 1 is a diagram of a prior art parametric amplifier. A pump source $v_p$ supplies a high amplitude voltage of frequency $f_p$ at the terminals of capacitor $C(V)$, whose value is dependent on the applied voltage. An incident signal at frequency $f_s$ is supplied by a generator $V_s$ installed at the input of one of the paths 1 of a circulator A, while a second path 2 connects to capacitor $C(V)$, and a third path 3 connects to a load resistor $R_s$. In operation, the wave at frequency $f_s$ takes path 2 to capacitor $C(V)$ as indicated by the lower bent arrow. It is amplified and reflected towards path 3, as indicated by the upper bent arrow towards the load resistor $R_s$. At the same time, in a third branch of the amplifier a signal is produced at frequency $f_o$ which, as indicated hereinbefore, is linked with the preceding frequencies $f_p$ and $f_s$. In a parametric amplifier frequency $f_p$ is several times to several dozen times frequency $f_s$ and the power gain is approximately 10 to 15 decibels.

In the drawing, R, $R_o$ and $R_p$ designate respectively the series loss resistance of capacitor $C(V)$ and shunts at frequencies $f_o$ and $f_p$. The rectangles $f_s$, $f_p$ and $f_o$ indicate band pass filters at the different frequencies.

In a parametric amplifier, the power available on frequency $f_o$ remains unused.

The same device can be used for producing the high frequency power at frequency $f_o$. However, to achieve this, certain impedance conditions must be satisfied.

Assuming that $Z_c(f_p)$ represents the impedance of the non-linear capacitor $C(V)$ at pump frequency $f_p$; and taking account of the impedances of the two other branches, and $jX_p + R_p$, the impedance of the branch of frequency $f_p$ then we obtain:

$$Z_c(f_p) + R_p + jX_p = 0 \qquad (I)$$

In the same way, if $Z_c(f_s)$ designates the impedance of capacitor $C(V)$ at frequency $f_s$ for an oscillation to be established at frequency $f_s$ it is necessary to have the equation:

$$Z_s + Z_c(f_s) = 0 \qquad (II)$$

between the impedance $Z_s$ of the branch at frequency $f_s$ and the impedance $Z_c(f_s)$.

If these two conditions are satisfied, then power is available on frequency $f_o$. It was created by the combinations of frequencies $f_s$ and $f_p$. Output power at frequency $f_o$ can be extracted in a load of a resonant circuit installed in the branch at frequency $f_o$ and tuned to the latter frequency; $Z_o$ represents the impedance of this load.

These conditions are satisfied in the oscillator according to the invention. In addition, the generator of the pump frequency is a dipole element with negative resistance. The diagram thereof is FIG. 2, wherein the common elements of this and the previous FIG. 1 have the same legends, except that in this FIG. 2 the elements of the pump branch have the letter D instead of the letter p. This is done to indicate that the pump generator is a dipole D with negative resistance $-R_D$, giving $-R_D = R_p$. The diagram shows both a first resonant circuit $C_o$ of impedance $Z_o$, to which reference has been made thereinbefore, and at the terminals of which is collected the power produced at frequency $f_o$, as well as a second resonant circuit $c_s$ in branch $f_s$. The latter circuit has a very considerable quality (or Q) factor on frequency $f_s$, to which reference was made hereinbefore.

Thus, in the oscillator according to one embodiment of the invention, the negative resistance dipole is integrated into the device, and its operating conditions are determined by all the parameters of the three branches. The gain, particularly in branch $f_s$, is sufficiently high to ensure oscillation.

These oscillation conditions are further explained with reference to FIG. 3 which shows the impedances (Z), the currents (I) and the powers (P) in each of the branches. The arrow accompanying each impedance and directed towards the capacitor C(V) indicates the value of said impedance as seen by capacitor C(V). The signs associated with the powers indicate whether there is power consumption or generation in the corresponding circuit.

It is apparent from this diagram that, in the oscillator according to the invention, there is power generation in the two branches at frequencies $f_o$ and $f_s$. This means that the system makes it possible to generate a high frequency power in the two branches other than the pump frequency branch. However, it is the higher frequency $f_o$ which is sought in the invention. As has been stated hereinbefore, stabilization on this frequency is possible by means of a lower frequency circuit having a better quality factor, mainly that of branch $f_s$. The noise is also lowest on branch $f_s$.

Two examples of frequency values attainable with the device according to the invention are:

$$f_s=10 \text{ GHz } f_D=45 \text{ GHz } f_o=35 \text{ GHz} \quad (1)$$
$$f_s=300 \text{ MHz } f_D=6 \text{ GHz } f_o=5.7 \text{ GHZ} \quad (2)$$

The first of these is obtained with a dielectric resonator and the second with a resonator having elastic surface waves on $f_s$. Thus, frequency $f_o$ can be approximately 20 times frequency $f_s$.

Power $P_D$ supplied to capacitor C(V) by the pump source is subdivided between the two other branches in accordance with the relationship:

$$P_s/f_s=P_D/f_D=P_o/f_o$$

in the case of a capacitor C(V) without losses (R=O with the aforementioned notations). It is apparent therefrom that most of the power supplied by the pump source is collected at frequency $f_o$. However, this relationship is modified in a real case which take into account the losses.

In this case, as soon as the power of the pump source exceeds the value necessary for the oscillation to appear at frequencies $f_s$ and $f_o$, the pump branch is equivalent to a circuit, whose quality factor is of the same order as that of the low frequency circuit $f_s$, no matter what the ratio $f_D/f_s$, i.e. even for pump frequencies very remote from frequency $f_s$.

The conditions to be respected to obtain the necessary level in the pump circuit, i.e. the charge conditions for the negative resistance dipole, are identical to those for a dipole installed on a single branch with a single operating frequency.

One of the uses of the oscillator according to the invention is as a local source in radio and more particularly radar reception installations.

Reference has been made to using non-linear or parametric capacitors C(V). The same results can be obtained with a non-linear reactance.

It should be noted that at given frequency $f_s$, the frequency $f_o$ can be tuned by variation of the reactance $X_D$ of the pump negative resistance dipole ($X_p$ in the equation (I)) without any correlative modification of the quality factor of the circuit at frequency $f_s$.

The device according to the invention can be constructed from solid state components. Two examples are given hereinafter. The resonant circuit with a high quality factor at frequency $f_s$ is a dielectric resonator, and the pump source is an avalanche or Gunn diode. The non-linear element in the case of a capacitor comprises a variable capacitance solid state diode comprising a diode reverse-polarized by a regulatable direct voltage which fixes the extension of the depletion zone. The three branches $f_s$, $f_o$ and $f_D$ are constituted by three wave guide portions of types used in microwave technology.

In the embodiment of FIG. 4, the dielectric resonator is designated by letter r, the variable capacitance diode by letter V, and the negative resistance diode by letter $\Delta$, a Gunn diode in the present case. The elements are located in the wave guide portions in the manner known in the art.

The rectangular wave guides are shown in section by the median plane parallel to their small sides. $F_1$ and $F_2$ respectively designates a band stop filter and a band pass filter. The hatched rectangle is a short-circuit which closes the horizontal guide at one of its ends, while the other end issues onto the (not shown) load impedance $Z_o$ at frequency $f_o$ which is conventionally matched. The guide is at cut-off for frequency $f_D$ in the right hand part of $F_2$. Here the two dials are separate. FIG. 5 is an alternative embodiment. An avalanche diode ($\Delta$, V) serves both as a pump frequency source C(V) and as a parametric variable inductance D. Here the two diodes are combined in one, i.e., the avalanche diode serves both as the dipole and as the non-linear reactance. In this case, the variable capacitance diode V serves only for electronic frequency tuning. It can be eliminated.

The resonators r are cylinders and are made from one of the materials conventionally used for this purpose. The drawings do not show the voltage sources, whose installation is in accordance with the prior art.

What is claimed is:

1. A stabilized microwave oscillator with frequency conversion for producing a wave of frequency $f_o$ comprising: a non-linear reactance; three parallel branches coupled to said non-linear reactance; said non-linear reactance's value being dependent on the voltage applied to it; the first of said three branches having a resonant circuit at frequency $f_s$; the second of said three branches having a resonant circuit at frequency $f_o$; and the third of said three branches having a negative resistance dipole for providing a pump wave at frequency $f_p$; said frequency $f_p$ substantially exceeding said frequency $f_s$, and frequency $f_o$=frequency $f_p$−frequency $f_s$; means for inputting power in the third branch; and means for extracting power at frequency $f_o$ from the second branch; stabilization in said second branch at frequency $f_o$ being achieved by adjusting the first branch at frequency $f_s$.

2. A stabilized oscillator according to claim 1, wherein the non-linear reactance comprises a solid state diode reverse-polarized by a regulatable voltage; and wherein the dipole comprises a negative resistance solid state diode.

3. A stabilized oscillator according to claim 2, wherein said reverse-polarized diode and said negative resistance diode are separate diodes.

4. A stabilized oscillator according to claim 2, wherein said dipole and said non-linear reactance, are both provided from a single avalanche diode.

5. A stabilized oscillator according to claim 3, wherein the two diodes are mounted in a median plane of a rectangular guide portion parallel to its small sides, said portion being closed at one of its ends on a short-circuit and at the other end coupled to said means for extracting power which is a load and which collects the wave at frequency $f_o$, said portion forming a T with another rectangular guide portion, to which it is connected by its large side and in which is placed the resonant circuit at frequency $f_s$.

6. A stabilized oscillator according to claim 5, wherein the resonant circuit at frequency $f_s$ is a dielectric resonator.

7. A stabilized oscillator according to claim 4, wherein the negative resistance diode and the non-linear reactance are mounted in the median plane of a rectangular wave guide portion parallel to its small sides, said portion being closed at one of its ends on a short-circuit, and at the other end coupled to means for extracting power which includes a load for collecting the wave at frequency $f_o$, said portion forming a T with another rectangular guide portion to which it is connected by its large side and in which is placed the resonant circuit at frequency $f_s$.

* * * * *